United States Patent
Zhang

(10) Patent No.: US 9,240,422 B2
(45) Date of Patent: Jan. 19, 2016

(54) TFT ARRAY SUBSRATE, FABRICATION METHOD, AND DISPLAY DEVICE THEREOF

(71) Applicant: BOE Technology Group Co., Ltd., Beijing (CN)

(72) Inventor: Mi Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/112,331

(22) PCT Filed: Feb. 7, 2013

(86) PCT No.: PCT/CN2013/071544
§ 371 (c)(1),
(2) Date: Oct. 17, 2013

(87) PCT Pub. No.: WO2013/135125
PCT Pub. Date: Sep. 19, 2013

(65) Prior Publication Data
US 2014/0061818 A1    Mar. 6, 2014

(30) Foreign Application Priority Data

Mar. 16, 2012    (CN) ...................... 2012 2 0102226 U

(51) Int. Cl.
*H01L 27/12*    (2006.01)
*G02F 1/1362*    (2006.01)

(52) U.S. Cl.
CPC ...... *H01L 27/1244* (2013.01); *G02F 1/136286* (2013.01); *H01L 27/1259* (2013.01); *G02F 1/136259* (2013.01); *G02F 2001/13629* (2013.01); *G02F 2201/121* (2013.01)

(58) Field of Classification Search
CPC .............. H01L 27/124; H01L 27/1244; H01L 27/1259; G02F 1/136209; G02F 1/136218; G02F 1/136286; G02F 1/13629; G02F 2201/122
See application file for complete search history.

(56) References Cited

U.S. PATENT DOCUMENTS 6,091,473 A * 7/2000 Hebiguchi ........ G02F 1/134363
349/138
6,342,937 B2 * 1/2002 Hiroshi ............. G02F 1/136213
349/128

(Continued)

FOREIGN PATENT DOCUMENTS

CN    101373301 A    2/2009
CN    101666948 A    3/2010

(Continued)

OTHER PUBLICATIONS

International Search Report for International Application No. PCT/CN2013/071544, 14pgs.

(Continued)

*Primary Examiner* — Fernando L Toledo
*Assistant Examiner* — Christine L Hagan

(57) ABSTRACT

A TFT array substrate, a fabrication method thereof and a display device. The TFT array substrate, comprising: gate lines (19), data lines (20) and a plurality of pixel units, each pixel unit comprises: a common electrode line (11), a gate insulating layer (16), a passivation layer (17) and a pixel electrode (12) in this order, wherein a backup common electrode line (41) is disposed at a position between the gate insulating layer (16) and the passivation layer (17) and opposite to the common electrode line (11), the backup common electrode line (41) is electrically insulated from the data line (20). The TFT array substrate with this structure can avoid the short circuit between the pixel electrode (12) and the common electrode line (11).

17 Claims, 3 Drawing Sheets

(56) References Cited

U.S. PATENT DOCUMENTS

| | | | | |
|---|---|---|---|---|
| 6,421,102 B2* | 7/2002 | Nakayama | G02F 1/136213 | |
| | | | 349/38 | |
| 6,445,435 B1* | 9/2002 | Seo | G02F 1/136213 | |
| | | | 349/141 | |
| 6,486,933 B1* | 11/2002 | Cha | G02F 1/134363 | |
| | | | 349/110 | |
| 6,549,258 B1* | 4/2003 | Shin | G02F 1/34363 | |
| | | | 349/141 | |
| 6,628,362 B2* | 9/2003 | Seo | G02F 1/136213 | |
| | | | 349/123 | |
| 6,690,445 B2* | 2/2004 | Matsumoto | G02F 1/13394 | |
| | | | 349/155 | |
| 6,697,140 B2* | 2/2004 | Seo | G02F 1/134363 | |
| | | | 349/141 | |
| 6,787,829 B2* | 9/2004 | Fukami | G02F 1/13463 | |
| | | | 257/184 | |
| 6,822,717 B2* | 11/2004 | Seo | G02F 1/136213 | |
| | | | 349/141 | |
| 6,924,863 B2* | 8/2005 | Nishida | G02F 1/134363 | |
| | | | 349/141 | |
| 7,072,017 B1 | 7/2006 | Yoo et al. | | |
| 7,446,833 B2* | 11/2008 | Nishida | G02F 1/134363 | |
| | | | 349/110 | |
| 7,636,143 B2* | 12/2009 | Chen | G02F 1/134363 | |
| | | | 349/139 | |
| 8,520,183 B2* | 8/2013 | Son | G02F 1/136209 | |
| | | | 349/139 | |
| 8,670,099 B2* | 3/2014 | Xie | G02F 1/134309 | |
| | | | 349/142 | |
| 8,742,781 B2* | 6/2014 | Chang | G09G 3/006 | |
| | | | 324/750.3 | |
| 2002/0159016 A1* | 10/2002 | Nishida | G02F 1/13463 | |
| | | | 349/141 | |
| 2002/0176043 A1* | 11/2002 | Fukami | G02F 1/134363 | |
| | | | 349/141 | |
| 2005/0117104 A1* | 6/2005 | Nishida | G02F 1/134363 | |
| | | | 349/141 | |
| 2011/0063538 A1* | 3/2011 | Xie | G02F 1/134309 | |
| | | | 349/43 | |
| 2012/0025855 A1* | 2/2012 | Chang | G09G 3/006 | |
| | | | 324/750.3 | |
| 2012/0257156 A1* | 10/2012 | Hiratsuka | G02F 1/134363 | |
| | | | 349/143 | |
| 2013/0027646 A1* | 1/2013 | Cho | G02F 1/133512 | |
| | | | 349/106 | |
| 2013/0050601 A1* | 2/2013 | Takeda | G02F 1/134363 | |
| | | | 349/41 | |
| 2013/0234143 A1* | 9/2013 | Hwang | G02F 1/1362 | |
| | | | 257/57 | |
| 2014/0061818 A1 | 3/2014 | Zhang | | |
| 2014/0071387 A1* | 3/2014 | Sakai | G02F 1/136209 | |
| | | | 349/110 | |
| 2014/0203281 A1* | 7/2014 | Chang | G09G 3/006 | |
| | | | 257/48 | |

FOREIGN PATENT DOCUMENTS

| | | | | |
|---|---|---|---|---|
| CN | 101833203 A | 9/2010 | | |
| CN | 202473922 U | 10/2012 | | |
| EP | 2717092 A1 * | 4/2014 | | G02F 1/136209 |
| WO | WO 2012165221 A1 * | 12/2012 | | |

OTHER PUBLICATIONS

English translation of Chinese Patent No. 101373301, 13pgs.
English translation of Chinese Patent No. 101666948, 25pgs.
English translation of Chinese Patent No. 101833203, 20pgs.
English translation of Chinese Patent No. 202473922, 15pgs.
International Preliminary Report for International Application No. PCT/CN2013/071544, 10 pages.

* cited by examiner

US 9,240,422 B2

TFT ARRAY SUBSRATE, FABRICATION METHOD, AND DISPLAY DEVICE THEREOF

CROSS REFERENCE TO RELATED APPLICATIONS

This application is based on International Application No. PCT/CN2013/071544 filed on Feb. 7, 2013, which claims priority to Chinese National Application No. 201220102226.9 filed on Mar. 16, 2012, the contents of which are incorporated herein by reference.

FIELD OF THE ART

Embodiments of the invention relate to the field of liquid crystal display, especially relate to a TFT array substrate, a manufacturing method, and a display device thereof.

BACKGROUND

Since thin film transistor liquid crystal display (TFT-LCD) has characteristics of small volume, low power consumption, no radiation and so on, it has become the leading products in the flat panel display market at present, wherein a TFT array substrate is the major component of the TFT-LCD.

A conventional TFT array substrate, as shown in FIG. 1, comprises: gate lines 19, data lines 20, and pixel units defined by the gate lines 19 and the data lines 20. Taking one of pixel units for example in FIG. 1, and at the same time referring to the sectional view of the pixel unit along the A-A line as shown in FIG. 2, it can be seen that the pixel unit comprises: a common electrode line 11, a gate electrode 13 of a thin film transistor, a source electrode 14 of the thin film transistor, a drain electrode 15 of the thin film transistor, a gate insulting layer 16, a semiconductor active layer, a passivation layer 17, a pixel electrode 12 and so on; wherein, the pixel electrode 12 is connected to the drain electrode 15 through a through-hole in the passivation layer between the passivation layer 17 and drain electrode 15.

As shown in FIG. 2, the gate insulating layer 16 and the passivation layer 17 are disposed between the common electrode line 11 and the pixel electrode 12, but when the through-hole in the passivation layer is fabricated by the conventional etching process, once the manufacturing error is presented, because the material of the passivation layer and the gate insulting layer is the same or similar to each other, the passivation layer will fracture, and it may also bring about the situation in which the gate insulating layer is eroded (for example, eroded by the etchant) and fractures in the same position. If this position is the location of the common electrode line, it will cause short circuit between the pixel electrode and the common electrode line, thus a bright spot or bright line may be presented on the liquid crystal display panel (display screen).

SUMMARY

Accordingly, in order to solve the problem of the short circuit between the pixel electrode and the common electrode line, embodiments of the invention provides a TFT array substrate, a manufacturing method, and a display device thereof.

The first aspect of the present invention provides a TFT array substrate, comprising: a plurality of gate lines, a plurality of data lines, a plurality of pixel units defined by the gate lines and the data lines, wherein each pixel unit comprises: a common electrode line and a pixel electrode, and a gate insulating layer as well as a passivation layer formed in this order between the common electrode line and the pixel electrode; wherein in each pixel unit, a backup common electrode line is disposed at a position between the gate insulating layer and the passivation layer and opposite to the common electrode line; and the backup common electrode line is electrically insulated from the data line.

The second aspect of the present invention provides a display device, comprising the aforementioned TFT array substrate.

The third aspect of the present invention provides a method of manufacturing a TFT array substrate comprising: forming a plurality of gate lines and a plurality of data lines on the substrate, and forming a plurality of pixel units in regions defined by the gate lines and data lines, wherein the formation of each of the pixel units comprising:

forming a common electrode line and a gate insulating layer in this order;

forming a backup common electrode line on the gate insulating layer, wherein the backup common electrode line is disposed at a position opposite to the common electrode line and the backup common electrode line is electrically insulated from the data line; and forming a passivation layer and a pixel electrode over the backup common electrode line.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE REFERENCE NUMERALS

11—common electrode line; 12—pixel electrode; 13—gate electrode; 14—source electrode; 15—drain electrode; 16—gate insulating layer; 17—passivation layer; 19—gate line; 20—data line; 41—backup common electrode line; 42—light-shielding strip; 43—backup light-shielding strip

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
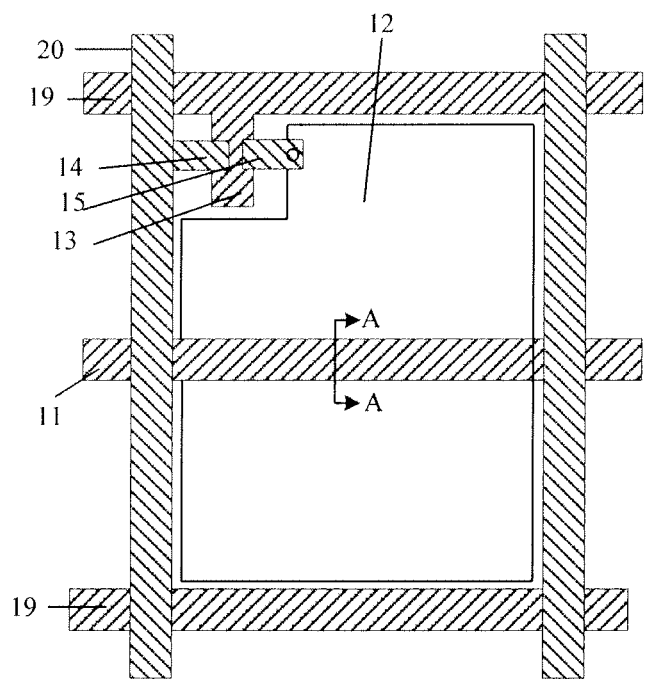
FIG. 1 is a top view of a conventional TFT array substrate.
Figure 2:
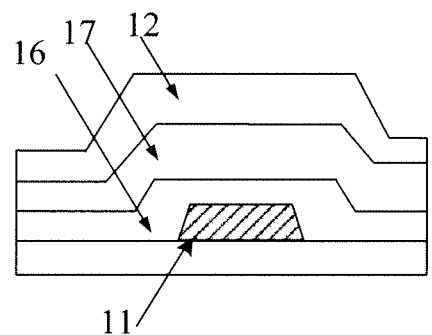
FIG. 2 is a sectional view of the array substrate taken along line A-A of FIG. 1.
Figure 3:
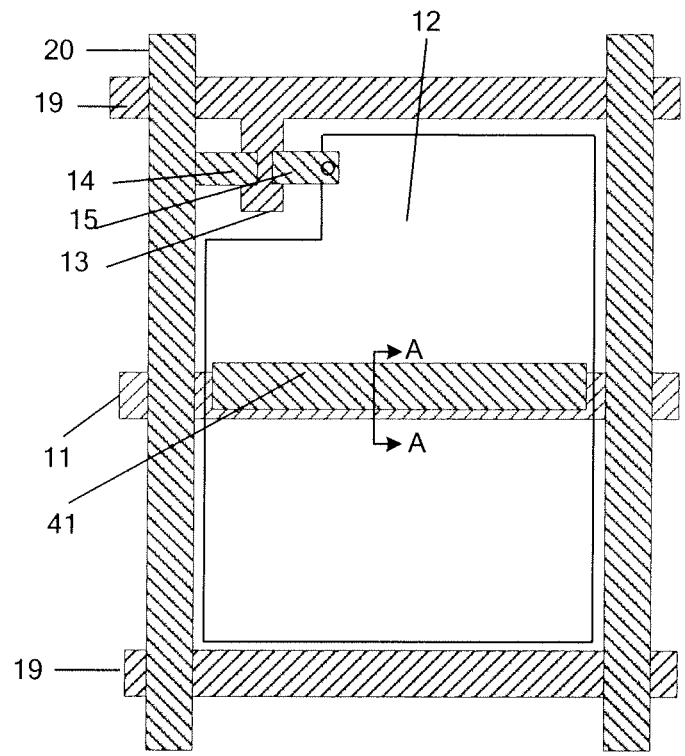
FIG. 3 is a top view of a TFT array substrate according to an embodiment of the invention.

As shown in FIG. 3, an embodiment of the invention provides a TFT array substrate, comprising: a plurality of gate lines 19, a plurality of data lines 20, a plurality of pixel units defined by the gate lines 19 and the data lines 20, wherein each pixel unit comprises: a common electrode line 11 and a pixel electrode 12, as well as a gate insulating layer 16 and a passivation layer 17 formed in this order between the common electrode line 11 and the pixel electrode 12. In each pixel unit, a backup common electrode line 41 is disposed at a position between the gate insulating layer 16 and the passivation layer 17 and opposite to the common electrode line 11, and the backup common electrode line 41 does not electrically connect to the data line 20, namely, they are electrically insulated from each other.

The backup common electrode line 41 can be made of the same material as the common electrode line 11, for example, it can be made by the metal such as copper, molybdenum or the like.

Figure 4:
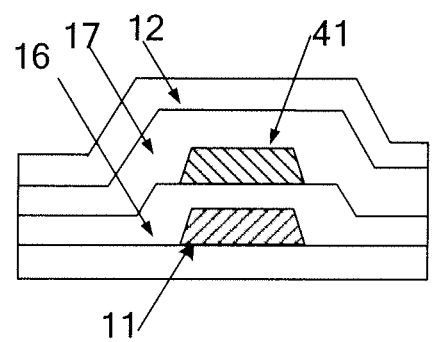
FIG. 4 is a sectional view of the array substrate taken along line A-A of FIG. 3.

It should be noted that, in order to simultaneously show the backup common electrode line 41 and the common electrode line 11 in the top view of FIG. 3, a slight dislocation at their positions can be seen in FIG. 3, but in fact the backup common electrode line 41 is disposed at the position opposite to the common electrode line 11 (namely at their overlapping position), which can be seen clearly in FIG. 4. Moreover, all the common electrode lines of the pixel units in the same row (the row is parallel to the gate line) can be connected together, normally, they form an integral structure. It should be noted that the backup common electrode line 41 added in the present embodiment is disposed at a position opposite to the common electrode line 11 in each pixel unit, and although each of the backup common electrode line 41 and the data line 20 is disposed between the gate insulating layer 16 and the passivation layer 17, the backup common electrode line 41 is not electrically connected to the data line 20, as shown in FIG. 3.

FIG. 4 is a sectional view of the TFT array substrate shown in FIG. 3 along the A-A line, by referring to FIG. 4, it is can be seen clearly that the gate insulating layer 16, the passivation layer 17 and the backup common electrode line 41 which is disposed at the position opposite to the common electrode line 11 and also disposed between the gate insulating layer 16 and the passivation layer 17 are disposed between the pixel electrode 12 and the common electrode line 11.

Figure 5:
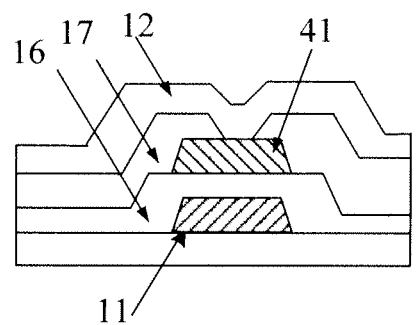
FIG. 5 is a sectional view of the array substrate when a passivation layer fractures.

The material of the passivation layer 17 is silicon nitride in general, while the material of the backup common electrode line 41 is the same as the common electrode line 11, so the methods of etching these two films 17 and 41 which made of different materials are not the same. As shown in FIG. 5, during the procedure of fabricating the through-hole in the passivation layer 17 by etching (the etching can be achieved by using either an etchant or gas for dry etching), even if the passivation layer 17 over the common electrode line 11 is eroded and fractures caused by the manufacturing error, the etching method of forming the through-hole in the passivation layer 17 is not capable of making damage to the backup common electrode line 41, thus the gate insulating layer 16 under the position of the backup common electrode line 41 will not fracture. As a result, the short circuit between the pixel electrode 12 and the common electrode line 11 can be avoided to some extent, and the bright point or bright line will not emerge on the display.

In addition, when the common electrode line 11 in one pixel unit fractures, the common electrode line 11 in this pixel unit can be connected with the backup common electrode line 41 by the laser welding method and so on, thus the normal transmission of the electrical signal on the common electrode line 11 can be ensured.

Preferably, the backup common electrode line 41 and the data line 20 are disposed in the same layer. In all the embodiments of the present invention, "same layer" refers to a plurality of patterns or structures which are formed by using the same material in the same and one fabricating step (i.e. patterning process). The procedure of disposing the backup common electrode line 41 and the data line 20 in the same layer comprises steps of: fabricating a metal thin film by using molybdenum, copper or other metal materials, and patterning the metal thin film by a patterning process, thus the data line 20 and the backup common electrode line 41 are obtained in the same layer. The pattern of the source and drain electrodes of the TFT can also be formed in the metal thin film. Disposed in the same layer can make the manufacturing process simple, so it is preferred. Of course, the backup common electrode line 41 and the data line 20 can also be disposed in two different layers in the embodiments of the present invention. In that case, it needs to form two metal thin films and then pattern these two metal thin films respectively, such that the data line 20 and the backup common electrode line 41 can be obtained. There is a variety of methods for forming the metal thin film, so the present invention makes no limitation to it.

Figure 6:
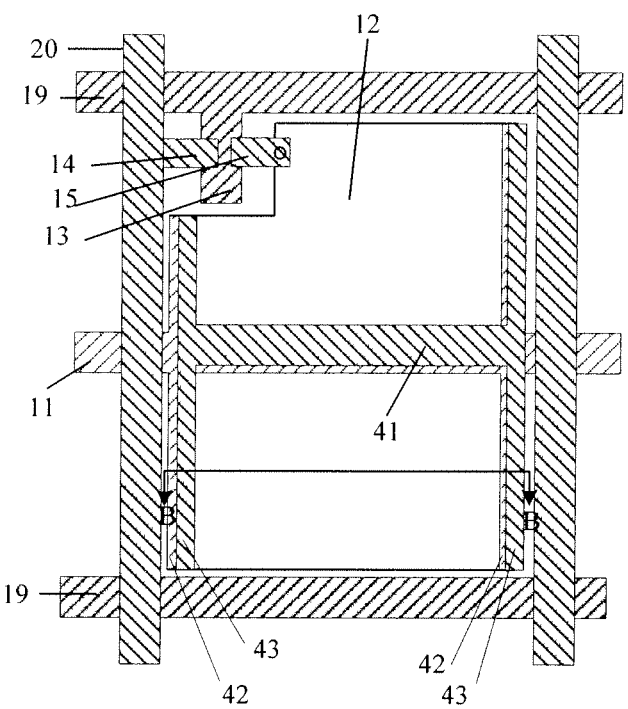
FIG. 6 is a top view of another TFT array substrate according to an embodiment of the invention.
Figure 7:
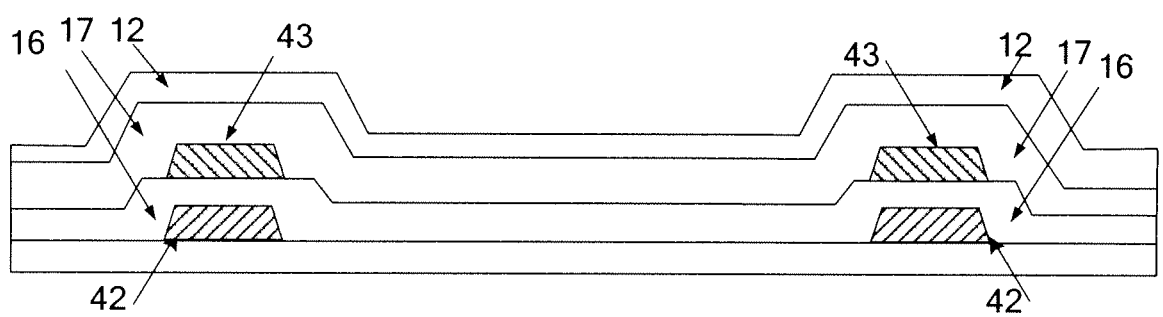
FIG. 7 is a sectional view of the array substrate taken along line B-B of FIG. 6.

In another embodiment, the pixel unit further includes a light-shielding strip 42, as shown in FIGS. 6 and 7. The light-shielding strip 42 and the common electrode line 11 can be of an integral structure (depending on the practical condition, they can also be of a non-integral structure). As shown in FIGS. 6 and 7, the light-shielding strip 42 is disposed near the opposite edges of the pixel unit 12 and located in the same layer with the common electrode line 11, which is used to improve the light leakage phenomenon in the pixel unit.

Referring to FIG. 6 and FIG. 7, in order to further prevent the short circuit between the pixel electrode 12 and the light-shielding strip 42, each pixel unit in the TFT array substrate of the present invention may further comprises a backup light-shielding strip 43, which is disposed on the position opposite to the light-shielding strip 42 and also between the gate insulating layer 16 and the passivation layer 17. The backup light-shielding strip 43 is not electrically connected to the data line 20.

It should be noted that, in order to simultaneously show the light-shielding strip 42 and the backup light-shielding strip 43 in FIG. 6, a slight dislocation can be seen at their relative positions, but in fact the light-shielding strip 42 is opposite to the backup light-shielding strip 43. In FIG. 7, it can be clearly seen that the positions of the light-shielding strip 42 and the backup light-shielding strip 43 are opposite to each other (overlap with each other). It should be noted that, although both the backup light-shielding strip 43 and the data line 20 are disposed between the gate insulating layer 16 and the passivation layer 17, the backup light-shielding strip 43 and the data line 20 are not electrically connected to each other.

When the passivation layer 17 and the gate insulating layer 16 fractures at the location of the light-shielding strip 42, the pixel unit 12 is electrically connect to the light-shielding strip 42, especially for the situation in which the light-shielding strip 42 and the common electrode line 11 is an integral structure, it may lead to a short circuit between the pixel electrode 12 and the common electrode line 11. In order to prevent the short circuit between the pixel unit 12 and the common electrode line 11, in the embodiment of the present invention, the backup light-shielding strip 43 is disposed between the gate insulating layer 16 and the passivation layer 17.

Specifically, with disposing the backup light-shielding strip 43, even if the passivation layer 17 is eroded and fractures, the etching procedure (the etching can be achieved by using either an etchant or gas for dry etching) of forming the through-hole in the passivation layer 17 is not capable of making damage to the backup light-shielding strip 43, thus the gate insulating layer 16 under the position of the backup light-shielding strip 43 will not fracture. As a result, in the area of the backup light-shielding strip 43, the short circuit between the pixel electrode 12 and the light-shielding strip 42 can be avoided. There is another possible situation where the passivation layer 17 may fracture when it is squeezed or doped with impurities, since the presence of the backup light-shielding strip 43, the gate insulating layer 16 under it will not fracture, so in the area of the backup light-shielding strip 43, the short circuit between the pixel electrode 12 and the light-shielding strip 42 can be avoided, and the short circuit between the pixel electrode 12 and the common electrode line 11 can be also avoid.

In this embodiment, the backup light-shielding strip 43 and the backup common electrode line 41 can also be of a non-integral structure, but as shown in FIG. 6, it is preferred that the backup light-shielding strip 43 and the backup common electrode line 41 are of an integral structure, because in the pixel unit of FIG. 6, the region of the backup light-shielding strip 43 and the backup common electrode line 41 of the integral structure entirely correspond to the regions of the light-shielding 42 and the common electrode line 11 of the integral structure, thus the short circuit, which may occur at any positions of the area of the light-shielding 42 and the common electrode line 11, can be prevented from the pixel unit 12.

Preferably, in each pixel unit, the pattern of the backup common electrode line 41 covers the pattern of the common electrode line 11 completely. In this case, when the passivation layer 17 is eroded and fractures, since the etching method of forming the through-hole in the passivation layer 17 is not capable of making damage to the backup common electrode line 41, the gate insulating layer 16 will not fracture, at this time, since the pattern of the backup common electrode line 41 covers the pattern of the common electrode line 11 completely, the short circuit between the area of the common electrode line 11 and the pixel electrode 12 can be better avoided.

Preferably, in each pixel unit, the pattern of the backup light-shielding strip 43 covers the pattern of the light-shielding strip 42 completely. In this case, when the passivation layer 17 is eroded and fractures, due to the etching method of forming the through-hole in the passivation layer 17 is not capable of making damage to the backup light-shielding strip 43, the gate insulating layer 16 will not fracture, at this time, since the pattern of the backup light-shielding strip 43 covers the pattern of the light-shielding strip 42 completely, thereby the short circuit between the area of the light-shielding strip 42 and the pixel electrode 12 can be avoided, furthermore, the short circuit between the common electrode 11 and the pixel electrode 12 can be also avoid.

It should be noted that the pattern of the common electrode line 11 in a pixel unit refers to the overlapping area between the common electrode line 11 and the pixel electrode 12. The "complete cover" refers to that the upper pattern completely blocks the lower pattern from a top view; of course, in a special case, the "complete cover" refers to complete overlapping.

Preferably, the backup light-shielding strip 43 and the data line 20 are disposed in the same layer. When the backup light-shielding strip 43 and the backup common electrode line 41 are integral structure, it is preferred that the backup common electrode line 41, the backup light-shielding strip 43 and the data line 20 are disposed in the same layer. Specifically, three patterns of the respective backup common electrode line 41, the backup light-shielding strip 43 and the data line 20 are formed in the same thin film by using the patterning process. The procedure of disposing the backup common electrode line 41, the backup light-shielding strip 43 and the data line 20 in the same layer comprises steps of: fabricating a source/drain metal thin film by using the molybdenum, copper or other metal materials, and patterning the source-drain metal by a patterning process so as to form the data line 20, the backup common electrode line 41, the backup light-shielding strip 43 and the pattern of the source electrode and drain electrode of the TFT. Disposed in the same layer can make the manufacturing process simple, so it is preferred. Of course, in other embodiments of the present invention, the backup common electrode line 41, the backup light-shielding strip 43 and the data line 20 can be disposed in the three different layers.

An embodiment of the invention also provides a method of manufacturing the TFT array substrate, which comprises: forming the gate lines 19, the data line 20 and forming a plurality of pixel units in regions defined by the gate lines 19 and data lines 20 on the substrate, wherein the formation of each of the pixel units comprises:

forming the common electrode line 11 and the gate insulating layer 16 in this order;

forming the backup common electrode line 41 on the insulating layer 16, the backup common electrode line 41 is disposed at a position opposite to the common electrode line 11 and electrically insulated from the data line 20; and forming the passivation layer 17 and the pixel electrode 12 over the backup common electrode line 41.

In an example, the backup common electrode lines 41 and the data line 20 are preferably formed in the same layer, which can make the production process simple. Specifically, the procedure of forming the backup common electrode line 41 and the data line 20 comprises steps of: fabricating a metal thin film by using molybdenum, copper or other metal materials, and patterning the metal thin film by a patterning process, so as to form the pattern of the data line 20 and the backup common electrode line 41. The pattern of the source and drain electrodes of the TFT can also be formed in the metal thin film. In addition, the pattern of the backup common electrode line 41 is preferably configured to completely cover the pattern of the common electrode line 11.

In another example, the formation of each of the pixel unit further comprises:

forming the light-shielding strip 42, and forming the backup light-shielding strip 43 between the gate insulting layer 16 and the passivation layer 17, the backup light-shielding strip 43 is disposed at the position opposite to the light-shielding strip 42 and electrically insulated from the data line 20, thereby preventing the short circuit between the pixel electrode 12 and the light-shielding strip 42.

The backup light-shielding strip 43 and the data line 20 are preferably formed in the same layer; more preferably, the backup common electrode line 41, the backup light-shielding strip 43 and the data line 20 are all disposed in the same layer, so as to simple the manufacture process. In addition, the pattern of the backup light-shielding strip 43 is preferably configured to completely cover the pattern of the light-shielding strip 42. The backup light-shielding strip 43 and the backup common electrode line 41 are preferably of an integral structure.

An embodiment of the invention also provides a display device comprising a TFT array substrate in any of the above embodiments. For example, the TFT array substrate comprises: a plurality of gate lines 19, a plurality of data lines 20, a plurality of pixel units defined by the gate lines 19 and the data lines 20, wherein each pixel unit comprises: a common electrode line 11 and a pixel electrode 12, and a gate insulating layer 16 and a passivation layer 17 formed in this order between the common electrode line 11 and the pixel electrode 12; wherein in each pixel unit, a backup common electrode line 41 is disposed at a position between the gate insulating layer 16 and the passivation layer 17 and also opposite to the common electrode line 11; and the backup common electrode line 41 is electrically insulated from the data line 20.

An example of the display device is a liquid crystal display device, in which the TFT array substrate and an opposed substrate are disposed opposite to each other so as to form a liquid crystal cell, and a liquid crystal material is filled in the liquid crystal cell. The opposed substrate is, for example, a color filter substrate. A pixel electrode in each pixel unit of the TFT array substrate acts to apply an electric field for controlling the rotation degree of the liquid crystal material, so as to conduct a display operation. In some examples, the liquid crystal display device further comprises a backlight source used to provide backlight for the TFT array substrate.

Another example of the display device is an organic electroluminescent display device, in which a layer of the organic luminescent material is formed on the TFT array substrate, and a pixel electrode in each pixel unit of the TFT array substrate functions as an anode or a cathode for driving an organic light emitting material to emit light, so as to conduct a display operation.

Still another example of the display device is an E-paper display device, in which a layer of electron ink is formed on the TFT array substrate, and a pixel electrode in each pixel unit of the TFT array substrate is used to apply the voltage for driving charge particles to move in the electron ink, so as to conduct a display operation.

What are described above is related to the illustrative embodiments of the disclosure only and not limitative to the scope of the disclosure; the scopes of the disclosure are defined by the accompanying claims.

What is claimed is:

1. A TFT array substrate, comprising: a plurality of gate lines, a plurality of data lines, a plurality of pixel units defined by the gate lines and the data lines, wherein each pixel unit comprises: a common electrode line and a pixel electrode, and a gate insulating layer as well as a passivation layer formed in this order between the common electrode line and the pixel electrode; wherein in each pixel unit, a backup common electrode line is disposed at a position between the gate insulating layer and the passivation layer and opposite to the common electrode line; and the backup common electrode line is electrically insulated from the data line.

2. The array substrate of claim 1, wherein in each pixel unit, the pattern of the backup common electrode line covers the pattern of the common electrode line completely.

3. The array substrate of claim 1, wherein the backup common electrode line and the data line are disposed in the same layer.

4. The array substrate of claim 1, wherein the pixel unit further comprises a light-shielding strip, and in each pixel unit, a backup light-shielding strip is disposed at a position between the gate insulating layer and the passivation layer and opposite to the light-shielding strip; the backup light-shielding strip is electrically insulated from the data line.

5. The array substrate of claim 4, wherein the backup light-shielding strip and the backup common electrode line are of an integral structure.

6. The array substrate of claim 4, wherein in each pixel unit, the pattern of the backup light-shielding strip covers the pattern of the light-shielding strip completely.

7. The array substrate of claim 4, wherein the backup light-shielding strip and the data line are disposed in the same layer.

8. The array substrate of claim 4, wherein the backup common electrode line, the backup light-shielding strip and the data line are disposed in the same layer.

9. A display device, comprising the TFT array substrate of claim 1.

10. A method of manufacturing a TFT array substrate, comprising: forming a plurality of gate lines and a plurality of data lines on the substrate, and forming a plurality of pixel units in regions defined by the gate lines and data lines, wherein the formation of each pixel unit comprising:

forming a common electrode line and a gate insulating layer in this order;

forming a backup common electrode line on the gate insulating layer, wherein the backup common electrode line is disposed at a position opposite to the common electrode line and the backup common electrode line is electrically insulated from the data line;

forming a passivation layer and a pixel electrode over the backup common electrode line.

11. The manufacturing method of claim 10, wherein in each pixel unit, the pattern of the backup common electrode line covers the pattern of the common electrode line completely.

12. The manufacturing method of claim 10, wherein the backup common electrode line and the data line are formed in the same layer.

13. The manufacturing method of claim 10, wherein the formation of each pixel unit further comprises:

forming a light-shielding strip, and forming a backup light-shielding strip between the gate insulating layer and the passivation layer, the backup light-shielding strip is disposed at a position opposite to the light-shielding strip and the backup light-shielding strip is electrically insulated from the data line.

14. The manufacturing method of claim 13, wherein the backup light-shielding strip and the backup common electrode line are of an integral structure.

15. The manufacturing method of claim 13, wherein in each pixel unit, the pattern of the backup light-shielding strip covers the pattern of the light-shielding strip completely.

16. The manufacturing method of claim 13, wherein the backup light-shielding strip and the data line are formed in the same layer.

17. The manufacturing method of claim 13, wherein the backup common electrode line, the backup light-shielding strip and the data line are formed in the same layer.

* * * * *